(12) United States Patent
Kwon et al.

(10) Patent No.: US 10,468,351 B2
(45) Date of Patent: Nov. 5, 2019

(54) MULTI-CHIP SILICON SUBSTRATE-LESS CHIP PACKAGING

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 328 days.

(21) Appl. No.: 14/469,500

(22) Filed: Aug. 26, 2014

(65) Prior Publication Data

US 2016/0064328 A1    Mar. 3, 2016

(51) Int. Cl.

| | |
|---|---|
| *H01L 23/538* | (2006.01) |
| *H01L 25/065* | (2006.01) |
| *H01L 25/00* | (2006.01) |
| *H01L 23/00* | (2006.01) |
| *H01L 25/07* | (2006.01) |
| *H01L 23/16* | (2006.01) |
| *H01L 21/683* | (2006.01) |

(Continued)

(52) U.S. Cl.
CPC ...... *H01L 23/5383* (2013.01); *H01L 21/6835* (2013.01); *H01L 23/16* (2013.01); *H01L 23/5384* (2013.01); *H01L 24/17* (2013.01); *H01L 24/81* (2013.01); *H01L 25/0652* (2013.01); *H01L 25/0657* (2013.01); *H01L 25/071* (2013.01); *H01L 25/50* (2013.01); *H01L 23/3128* (2013.01); *H01L 23/49816* (2013.01); *H01L 2221/68345* (2013.01); *H01L 2224/16225* (2013.01); *H01L 2224/17181* (2013.01); *H01L 2224/32225* (2013.01); *H01L 2224/73204* (2013.01); *H01L 2224/73253* (2013.01); *H01L 2224/81005* (2013.01); *H01L 2224/81193* (2013.01); *H01L 2224/83005* (2013.01); *H01L 2224/92125* (2013.01); *H01L 2225/06517* (2013.01); *H01L 2924/07802* (2013.01); *H01L 2924/15311* (2013.01); *H01L 2924/181* (2013.01); *H01L 2924/18161* (2013.01)

(58) Field of Classification Search
CPC ......... H01L 21/76802; H01L 23/49822; H01L 21/4857; H01L 21/6835; H01L 23/5383
USPC ...................................................... 257/737
See application file for complete search history.

(56) References Cited

U.S. PATENT DOCUMENTS

2007/0905461    4/2007   Shioga et al.
2011/2104441    9/2011   Jeng et al.
(Continued)

*Primary Examiner* — Julio J Maldonado
*Assistant Examiner* — Hajar Kolahdouzan
(74) *Attorney, Agent, or Firm* — Patterson + Sheridan, LLP (57) ABSTRACT

Examples generally provide a stacked silicon interconnect product and method of manufacture. The stacked silicon interconnect product includes a silicon substrate-less interposer comprising a plurality of metallization layers, wherein at least one metallization layer includes a plurality of metal segments separated by dielectric material. The stacked silicon interconnect product also includes a first die coupled to a first side of the silicon substrate-less interposer via a first plurality of microbumps. The stacked silicon interconnect product further includes a second die coupled to a second side of the silicon substrate-less interposer via a second plurality of microbumps, the second die communicatively coupled to the first die through a metallization layer of the plurality of metallization layers.

10 Claims, 13 Drawing Sheets

(51) Int. Cl.
*H01L 23/498* (2006.01)
*H01L 23/31* (2006.01)

(56) References Cited

U.S. PATENT DOCUMENTS

| | | |
|---|---|---|
| 2013/1872921 | 7/2013 | Semmelmeyer et al. |
| 2013/0242493 A1* | 9/2013 | Shenoy et al. ........... 361/679.21 |
| 2014/0048932 A1* | 2/2014 | Pagaila ...................... 257/737 |
| 2014/0217604 A1* | 8/2014 | Chou ..................... H01L 24/11 |
| | | 257/774 |
| 2016/0056102 A1* | 2/2016 | Konchady ......... H01L 23/49822 |
| | | 174/263 |

\* cited by examiner

MULTI-CHIP SILICON SUBSTRATE-LESS CHIP PACKAGING

TECHNICAL FIELD

The present disclosure generally relates to chip packaging technology, and in particular, to multi-chip silicon substrate-less chip packaging.

BACKGROUND

Electronic devices, such as tablets, computers, copiers, digital cameras, smart phones, control systems and automated teller machines, among others, often employ electronic components such as dies that are packaged in chip packages. The dies may include memory, logic or other IC devices.

In many chip packages, one or more dies are generally coupled to an interposer that includes a silicon substrate. Such silicon substrate is generally a semiconductor (as opposed to a dielectric), as is also generally known. The interposer is coupled through solder balls to a package substrate for mounting onto a board. To electrically connect the one or more dies to the board, through-silicon vias (TSV's) are formed through the silicon substrate. The TSVs generally comprise holes formed through the silicon substrate that are filled with a conductive material.

In general, TSV's contribute to a relatively large portion of the fabrication cost, time, and complexity of a particular integrated chip package. Manufacturing complexity associated with TSV's results from the fact that forming TSV's require several manufacturing steps that cannot be done simply. TSV's also introduce other issues such as issues related to capacitive loading, issues related to handling during manufacturing, issues related to inspection, and other issues that have to be addressed and that increase design complexity, thus increasing the time and cost for creating a design.

Therefore, a need exists for improved chip packaging.

SUMMARY

A chip package including silicon substrate-less interposer and method for manufacturing are provided. Advantageously, the chip package including a silicon substrate-less interposer allows for mounting an integrated circuit chip onto a board without the use of TSV's. Because TSV's increase design complexity, cost of manufacturing, and testing time, among other factors, providing an interposer without TSV's allows for reduced manufacturing difficulty and cost.

In one example, a stacked silicon interconnect product is provided. The stacked silicon interconnect product includes a silicon substrate-less interposer comprising a plurality of metallization layers, wherein at least one metallization layer includes a plurality of metal segments separated by dielectric material. The stacked silicon interconnect product also includes a first die coupled to a first side of the silicon substrate-less interposer via a first plurality of microbumps. The stacked silicon interconnect product further includes a second die coupled to a second side of the silicon substrate-less interposer via a second plurality of microbumps, the second die communicatively coupled to the first die through a metallization layer of the plurality of metallization layers.

In another example, a method of fabricating a stacked silicon interconnect product is provided. The method includes coupling a first die to a first side of an interposer via a first plurality of microbumps, the first plurality of microbumps communicatively coupling the first die to a first metallization layer of the plurality of metallization layers. The method also includes removing a substrate from a second side of the interposer. The method further includes coupling a second die to the second side of the interposer via a second plurality of microbumps coupled, the second plurality of microbumps communicatively coupling the second die to a second metallization layer of the plurality of metallization layers.

In another example, a method of processing a data signal is provided. The method includes transmitting the data signal from a first die to a second die, the data signal routed between the first die and the second die through a stacked silicon interconnect product. The stacked silicon interconnect product includes a silicon substrate-less interposer comprising a plurality of metallization layers, wherein at least one metallization layer includes a plurality of metal segments separated by dielectric material. The stacked silicon interconnect product also includes a first die coupled to a first side of the silicon substrate-less interposer via a first plurality of microbumps. The stacked silicon interconnect product further includes a second die coupled to a second side of the silicon substrate-less interposer via a second plurality of microbumps, the second die communicatively coupled to the first die through a metallization layer of the plurality of metallization layers.

BRIEF DESCRIPTION OF THE DRAWINGS

So that the manner in which the above recited features of the present disclosure can be understood in detail, a more particular description, briefly summarized above, may be had by reference to the appended drawings. It is to be noted, however, that the appended drawings illustrate only examples and are therefore not to be considered limiting in scope.

To facilitate understanding, identical reference numerals have been used, where possible, to designate identical elements that are common to the figures.

DETAILED DESCRIPTION

This disclosure generally provides a stacked silicon interconnect product that includes multiple integrated circuit (IC) dies coupled to two sides of a substrate-less interposer. The substrate-less interposer provides access to the IC dies coupled to the interposer through metallization layers but without through-silicon-vias (TSV's). At least one of the IC dies is coupled to one side of the interposer and another IC die is coupled to the opposite side of the interposer, which also has controlled collapse chip connection (C4) bumps for connection to a circuit board. Coupling the IC dies with an interposer that has no TSV's helps to reduce issues associated with TSV's, such as extra cost associated with manufacturing TSV's and increased design complexity associated with TSV's. Additionally, "hiding" the second IC die underneath the first IC die may provide security benefits in sensitive applications. More specifically, because the second IC die is physically blocked by the first IC die, eavesdropping and/or other security attacks against the second IC die may be less successful than if the second IC die were exposed.

Figure 1:
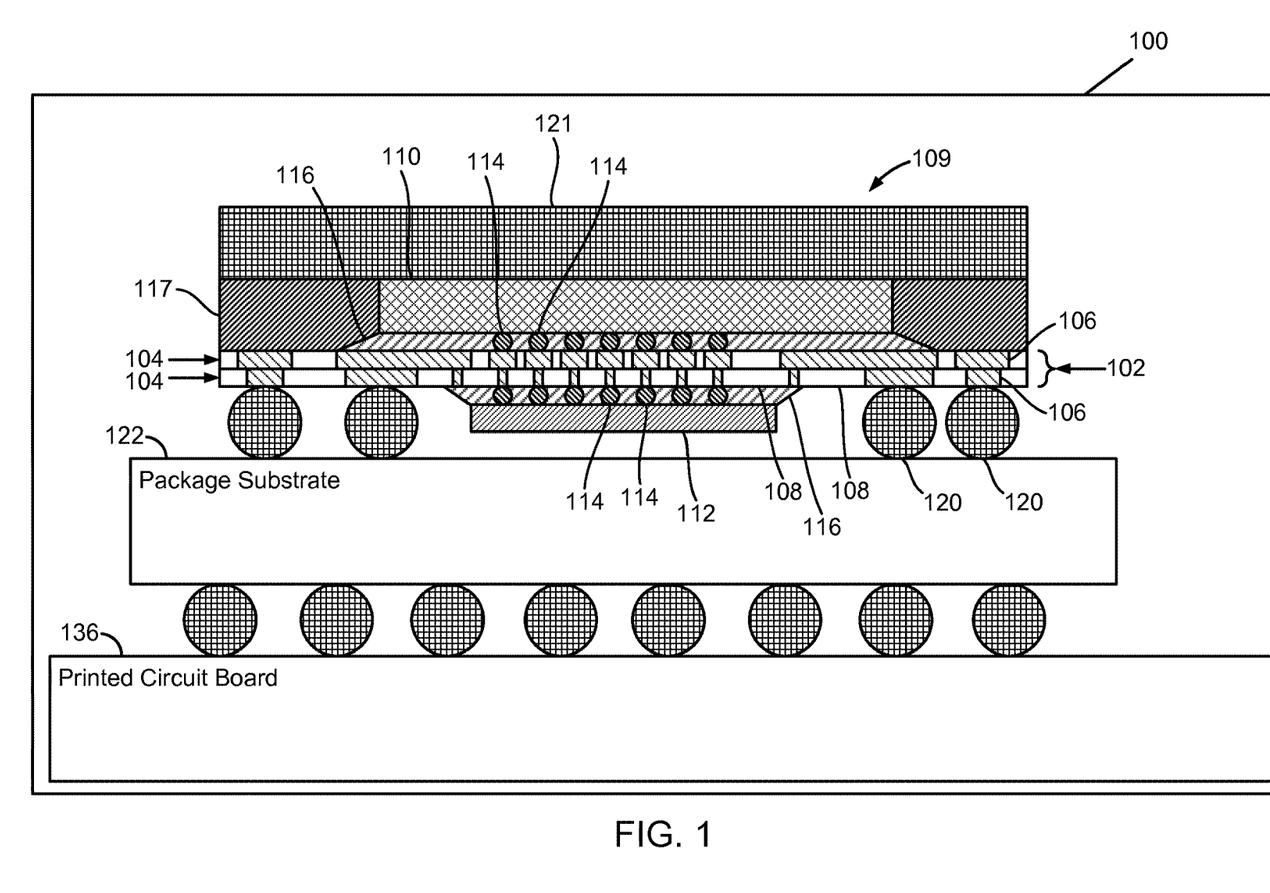
FIG. 1 is an illustration of an electronic device including a chip packaging with a silicon substrate-less interposer.

Turning now to FIG. 1, an exemplary electronic device 100 is schematically illustrated. The electronic device 100 includes an integrated chip package 109. The electronic device 100 may be a computer, tablet, cell phone, smart phone, consumer appliance, control system, automated teller machine, programmable logic controller, printer, copier, digital camera, television, monitor, stereo, radio, radar, or other device utilizing and having a chip package 109 disposed therein.

The chip package 109 includes a first IC die 110 and a second IC die 112, both coupled to a silicon substrate-less interposer 102 via microbumps 114. The first IC die 110 and second IC die 112 may be programmable logic devices, such as field programmable gate arrays (FPGA), memory devices, optical devices, processors or other IC logic structures. Optical devices include photo-detectors, lasers, optical sources, and the like. Further, the first IC die 110 and second IC die 112 may be homogenous (i.e., have generally the same functionality and construction) or may be heterogeneous (i.e., have a generally different functionality and construction).

The silicon substrate-less interposer 102 includes one or more metallization layers 104, which each include metal segments 106 separated by dielectric 108. The dielectric 108 may be silicon dioxide, SiN, SiC, or another dielectric material. The metal segments 106 may include copper, aluminum, or a different metal-based composition. The metal segments 106 may be vias, landing pads for bonding to microbumps 114 or C4 balls 120, or may be other metallic components within the silicon substrate-less interposer 102. Further, the metal segments 106 may include layers in addition to a metallic layer. Each metallization layer 104 may include one or more metal segments 106. Some metal segments 106 in the metallization layers 104 are coupled to the first IC die 110 and second IC die 112 via the microbumps 114. More specifically, within a top-most metallization layer 104, one or more metal segments 106 are coupled to a first set of microbumps 114, which are coupled to conductive elements within the first IC die 110. Within a bottom-most metallization layer 104, one or more metal segments 106 are coupled to a second set of microbumps 114, which are coupled to conductive elements within the second IC die 112. Thus, the first IC die 110 is coupled to a first surface of the silicon substrate-less interposer 102 via the first set of microbumps 114 and the second IC die 112 is coupled to a second surface of the silicon substrate-less interposer 102 via the second set of microbumps 114, where the first surface faces in an opposite direction from the second surface. The first die 110 may be communicatively coupled to the second die 112 through one or more metallization layers 104 included in the silicon substrate-less interposer 102.

A layer of non-conductive underfill material 116 is disposed between the first IC die 110 and the silicon substrate-less interposer 102 and between the second IC die 112 and the silicon substrate-less interposer 102. The underfill material 116 is generally an epoxy-based gap filling material for a flip chip structure. Alternatively, no underfill is disposed between the first IC die 110 and the silicon substrate-less interposer 102. In such situations, a molding compound (e.g., mold encapsulation 117) would provide sufficient support to hold the structure together and avoid warpage or damage. The first IC die 110 is surrounded by a mold encapsulation 117 comprised of encapsulation material. The mold encapsulation 117 encapsulates the first die 110 against the silicon substrate-less interposer 102 and provides structural stability and protection against environmental factors (e.g., temperature, external contaminants, and the like) that may affect performance of the first IC die 110 and the second IC die 112. The mold encapsulation may be an epoxy-based encapsulation material. The mold encapsulation 117 may be an identical material to the underfill 116. The first IC die 110 is also coupled to a structural substrate 121 (also referred to as a "stabilization layer") for structurally supporting the first IC die 110. The structural substrate 121 may be a silicon material, an organic film, a metal film, or combinations thereof. Alternatively, no structural substrate 121 is present, and another material other than structural substrate 121, such as a thermal compound, may cover the first IC die 110. When an underfill material is included between the first IC die 110 and the interposer 102, or when the first IC die 110 and/or second IC die 112 consume a lot of power, the structural substrate 121 should be present.

The metallization layers 104 of the silicon substrate-less interposer 102 include elements for electrically connecting the first IC die 110 and the second IC die 112 to the package substrate 122 so that data and power signals may be transmitted between the first IC die 110, the second IC die 112, and external elements, via the interposer 102, for processing. Package bumps, also referred to as C4 bumps 120, electrically connect the circuitry of the silicon substrate-less interposer 102 with the circuitry included in the package substrate 122. The C4 bumps 120 are located laterally outward from the second IC die 112. The package substrate 122 is mounted and connected to a printed circuit board (PCB) 136, utilizing solder balls 134, wire bonding or another suitable technique.

Figure 3:
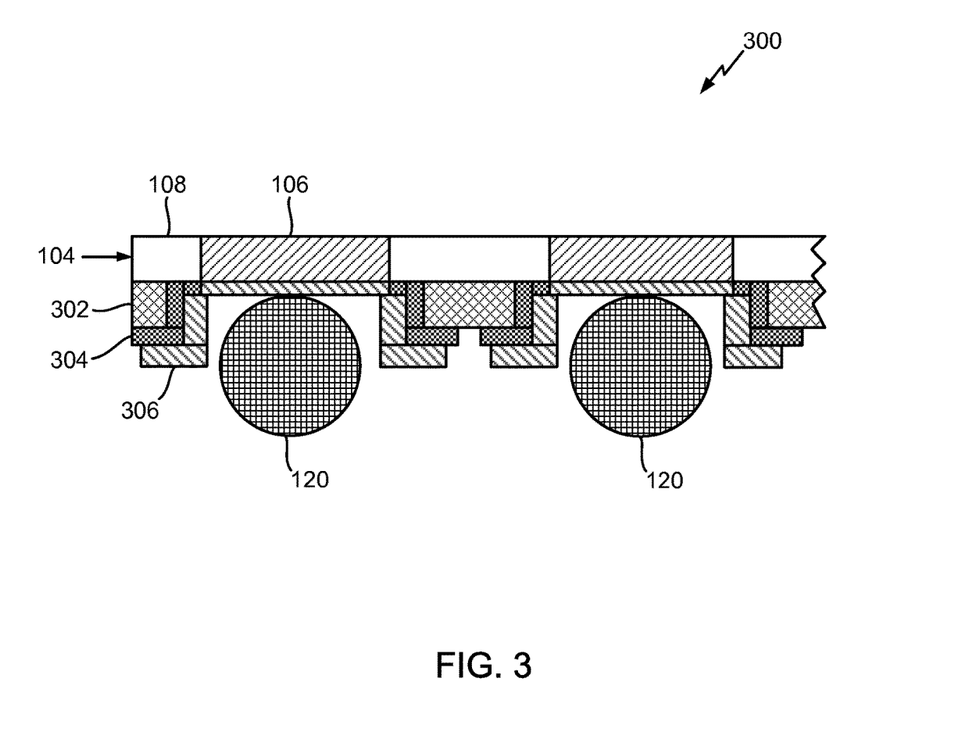
FIG. 3 illustrates a portion of a chip packaging with a silicon substrate-less interposer, including an interface between the interposer and C4 bumps.

The various elements and connections between elements illustrated in FIG. 1 are intended to represent a high level overview of the construction of these elements and connections. It should be understood that these various elements and connections may include various additional elements, such as additional layers and materials. For example, the connection between metal segments 106 and C4 bumps 120 may include additional layers and may have a generally concave shape, as is shown in FIG. 3.

The silicon substrate-less interposer 102 does not include a silicon substrate. Thus, the silicon substrate-less interposer 102 also does not include any through-silicon-vias (TSVs) through a silicon substrate. In other words, the metallization layers 104 of the silicon substrate-less interposer 102 interposer are sized, shaped, and positioned to electrically connect the first IC die 110 and the second IC die 112 to the package substrate 122 without the use of TSVs. While TSVs are not included in the silicon substrate-less interposer 102, other types of vias may be included. Such vias may include, for example, through-oxide vias, through-nitride vias, and other types of vias that do not extend through a crystalline Silicon material (or other similar type of material) that typically serves as a semiconductor substrate on which electrical components are disposed. The metal segments 106 included in each metallization layer 104 of the silicon substrate-less may include such non-TSV vias, as described above.

In comparison, in prior art chip packages, interposers are generally mounted on a silicon substrate. Subsequently, TSVs are formed through that substrate to electrically connect the metallization layers to another element in the package. Such silicon substrate is generally a semiconductor (as opposed to a dielectric), as is generally known.

In general, TSV's contribute to a large portion of the fabrication cost, time, and complexity of a particular integrated chip package. Manufacturing complexity associated with TSV's results from the fact that forming TSV's requires several manufacturing steps that cannot be done easily. TSV's also introduce other issues such as issues related to capacitive loading, issues related to handling during manufacturing, issues related to inspection, and other issues. Removing TSV's helps to eliminate or reduce these issues.

FIGS. 2A through 2F provide an overview of a technique for manufacturing the chip package 109 of FIG. 1. Although certain intermediate chip package configurations are illustrated, those of ordinary skill in the art will understand that additional steps that produce additional intermediate configurations are possible.

Figure 2A:
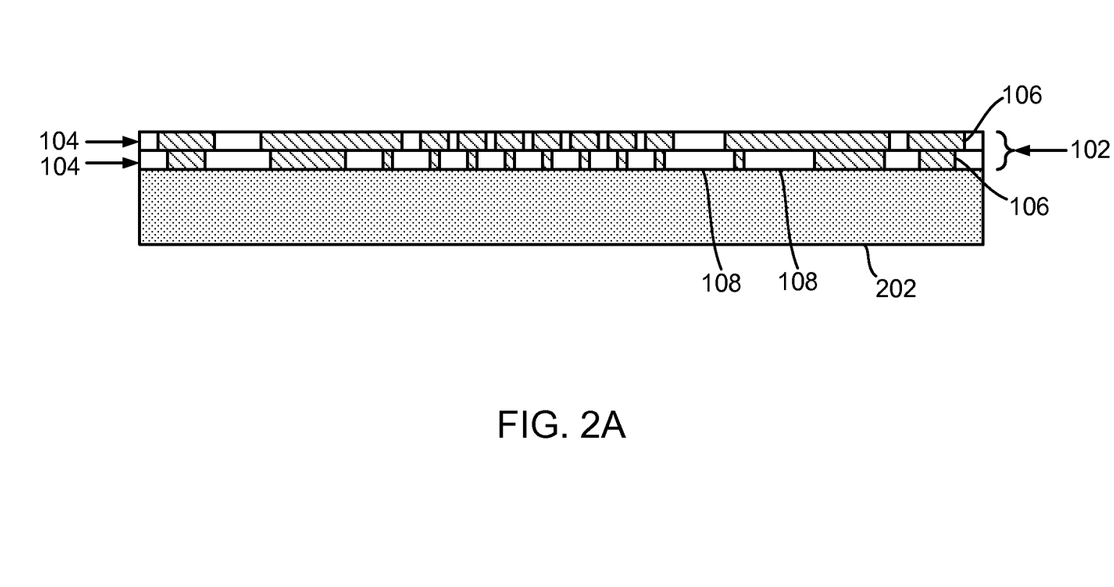
FIGS. 2A-2F illustrate several stages of a manufacturing process for constructing the chip packaging of FIG. 1.
Figure 2B:
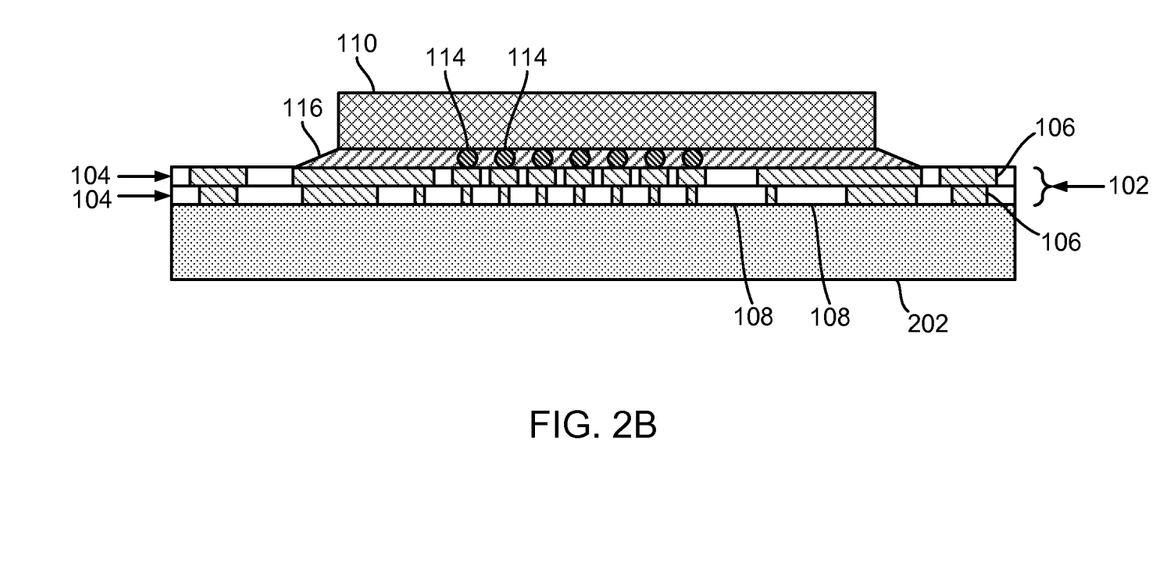

In FIG. 2A, a substrate 202 is provided, and metallization layers 104 are formed over the substrate 202. The substrate 202 may be a silicon substrate. The substrate 202 prevents warping and facilitates handling of the chip package 109 during manufacture. After this, as shown in FIG. 2B, the first IC die 110 is attached to a metallization layer 104 within the silicon substrate-less interposer 102 via microbumps 114. A layer of non-conductive underfill 116 is provided between the first IC die 110 and the silicon substrate-less interposer 102.

Figure 2C:
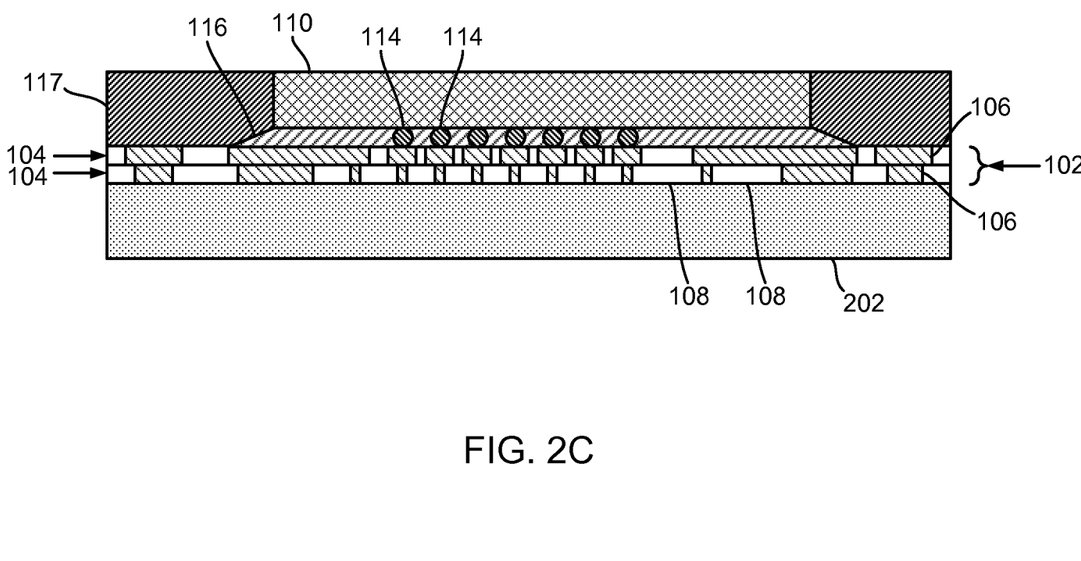
Figure 2D:
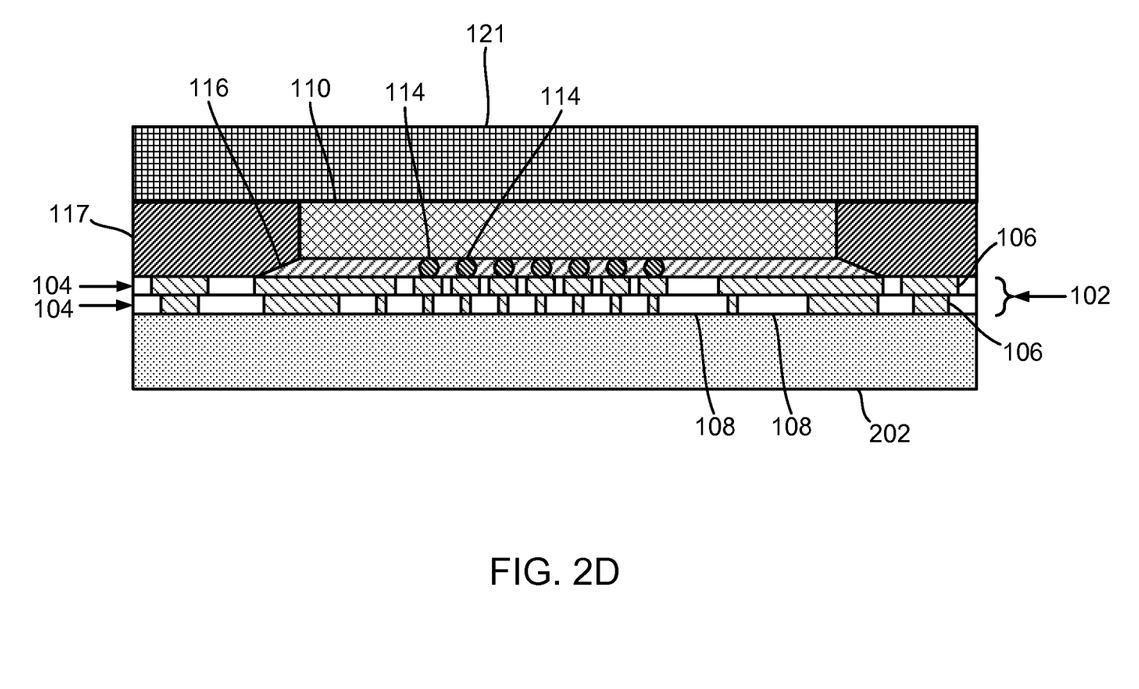
Figure 2E:
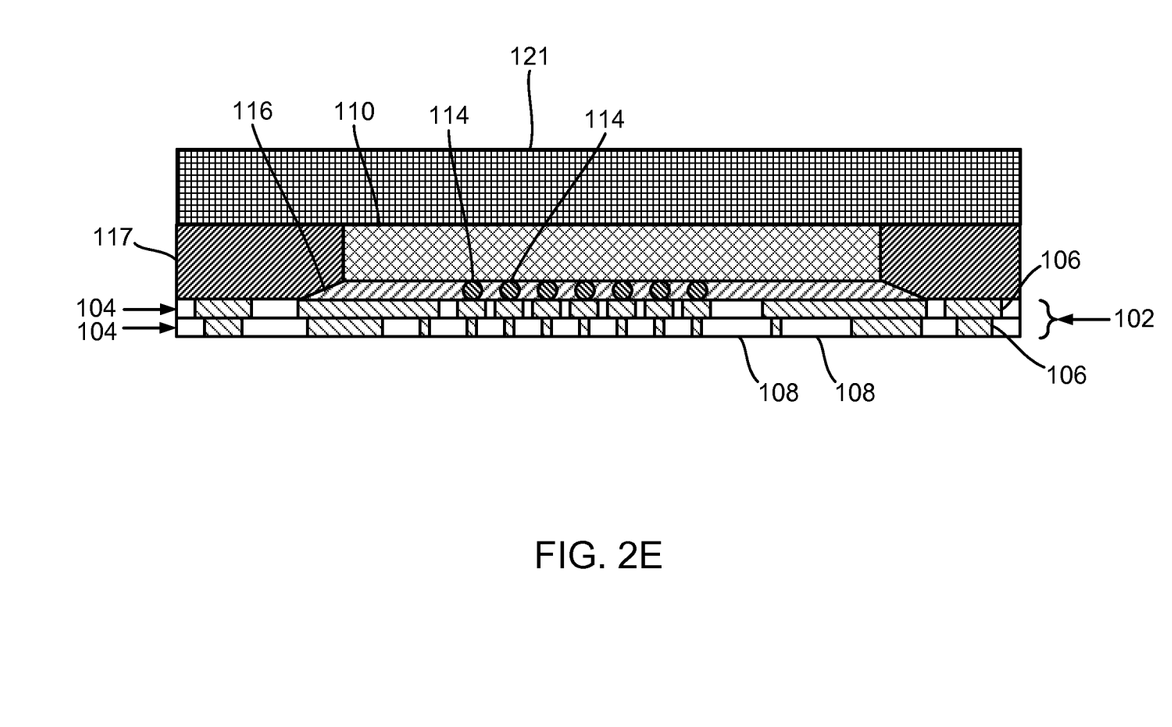
Figure 2F:
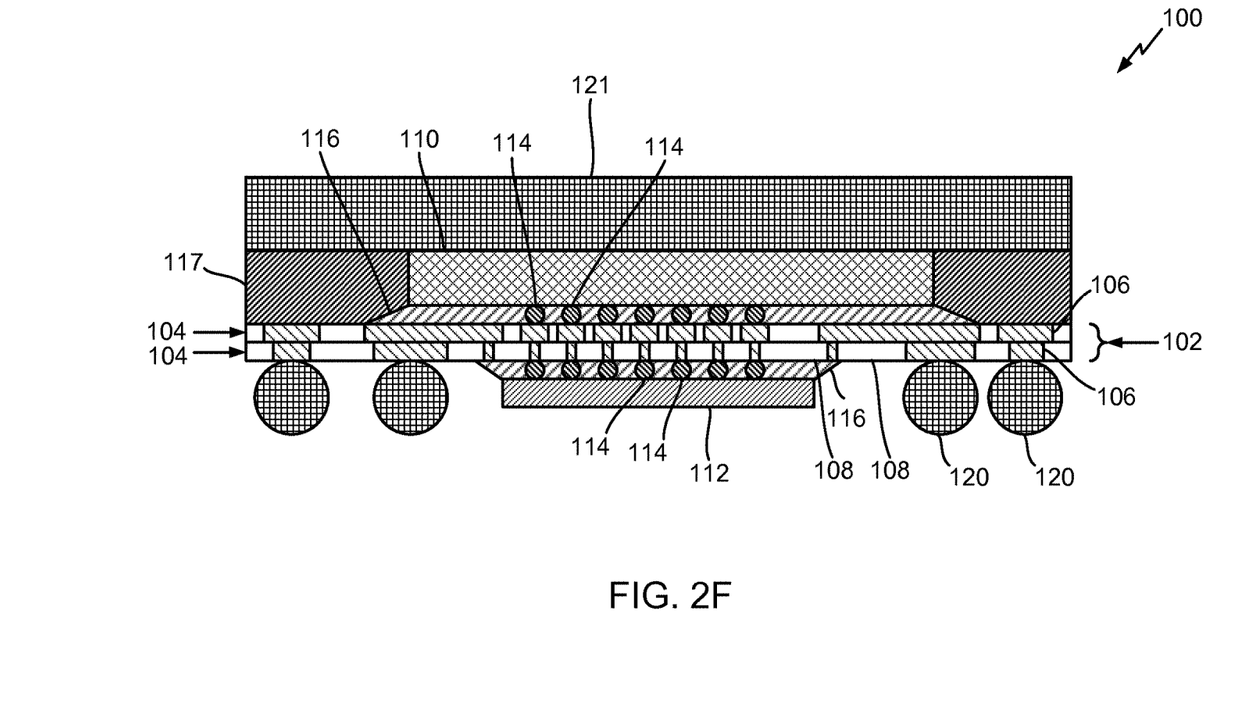

As shown in FIG. 2C, a mold encapsulation 117 is added, surrounding the first IC die 110. Subsequently, in FIG. 2D, a structural substrate 121 is added above the first IC die 110. In some cases, the structural substrate 121 may not be added to the chip package 109. In FIG. 2E, the substrate 202 is removed. In some situations, substrate 202 is removed by first mechanically grinding the substrate 202 to a particular thickness and then etching the remaining substrate 202 away. Finally, in FIG. 2F, the C4 bumps 120 and second IC die 112 are added. The second IC die 112 is coupled to the silicon substrate-less interposer 102 via microbumps 114.

FIG. 3 illustrates a portion of a chip package 109 that shows an interface 300 between the silicon substrate-less interposer 102 and C4 bumps 120. The interface between the bottom-most metallization layer 104 of the silicon substrate-less interposer 102 and the C4 bumps 120 includes a first passivation layer 302 (also referred to herein as a "dielectric layer"), a second passivation layer 304, and a conformal under-bump metal (UBM) layer 306. The first passivation layer 302 may be composed of $SiO_2$, SiN, SiC, or similar dielectric materials. The second passivation layer 304 may be composed of an organic polyimide or polybenzoxazole (PBO). The UBM layer is conformally formed over the second passivation layer 304. The dielectric layer 302 includes an opening that exposes a metal segment in the metallization layer 104. The second passivation layer 304 has an opening that corresponds spatially with the opening in the dielectric layer 302. The UBM layer 306 is conformally formed in the opening of the dielectric layer 302 and the second passivation layer 304 and is in contact with the metallization layer 104 (specifically, with a metal segment 106 in the metallization layer to provide access to the metal segment 106). The C4 bumps 120 are in electrical connection with the metallization layer 104.

If the integrated chip package 109 includes the first passivation layer 302, second passivation layer 304, and UBM layer 306, then several of the steps described above with respect to FIGS. 2A-2F include additional steps related to these layers. More specifically, the substrate provided in the step shown with respect to FIG. 2A includes the first passivation layer 302, over which the metallization layers 104 of the silicon substrate-less interposer 102 are formed. Additionally, in order to attach the C4 bumps 120, as described with respect to FIG. 2F, a portion of the first passivation layer 302 is etched to form one or more openings that provide access to the metal segments 106 of the bottom-most metallization layer 104, a second passivation layer 304 is conformally formed over the first passivation layer 302, and a conformal UBM layer 306 is formed over the second passivation layer 304. Additionally, the C4 bumps 120 are added in electrical connection with the UBM layer 306, as shown in FIG. 3. Thus, the C4 bumps 120 are in electrical connection with the metallization layer 104.

Figure 4A:
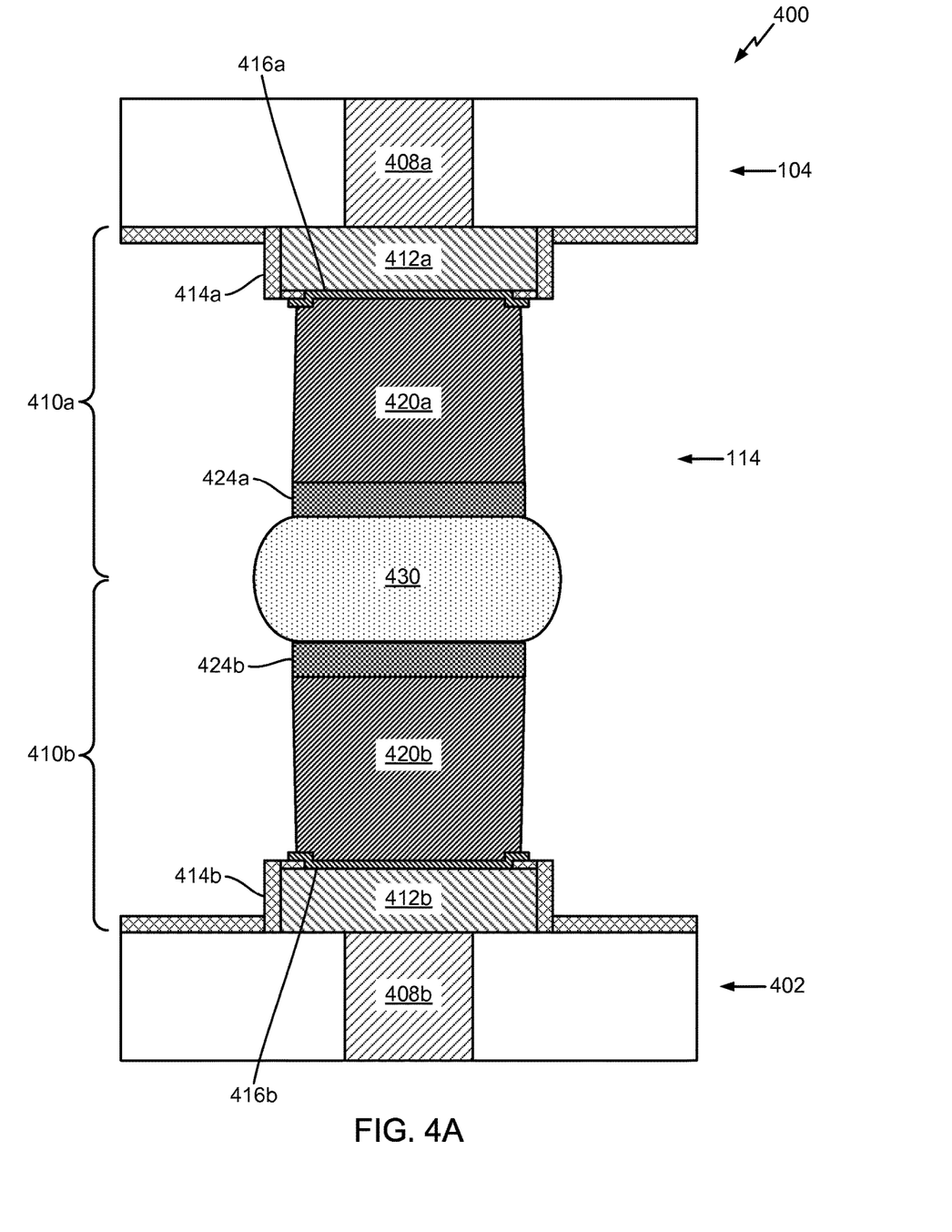
FIG. 4A is a detailed illustration of a solder microbump connection, as included in the chip packaging of FIG. 1.

FIG. 4A is a detailed illustration of a solder microbump connection 400. As shown, the solder microbump connection 400 includes a microbump 114, coupled to a metallization layer 104 of the silicon substrate-less interposer 102 and to an IC die 402 (which may be, for example, the first IC die 110 or second IC die 112 of FIG. 1, or another IC die).

The microbump 114 comprises a first solder micro-bump assembly 410a coupled with a second solder micro-bump assembly 410b. It should be noted that FIG. 4 shows the first solder micro-bump assembly 410a coupled with a second solder micro-bump assembly 410b after exposure to a solder reflow process to couple the micro-bump assemblies 410a, 410b together, thus forming the solder micro-bump connection 400.

A layer of metal is deposited on each of the silicon substrate-less interposer 102 and the IC die 402 to define conductive bond pads 412a, 412b. Each conductive bond pad 412a, 412b is in electrical communication with one or more conductive elements 408a, 408b within silicon substrate-less interposer 102 and IC die 402. Within the silicon substrate-less interposer 102, the conductive element 408a may be a metal segment 106 as illustrated in FIG. 1.

A passivation layer 414a, 414b is formed over silicon substrate-less interposer 102 and IC die 402 near conductive element 408 and over a portion of each conductive bond pad 412a, 412b. Each passivation layer 414a, 414b may be a silicon nitride layer. The silicon nitride layer may be deposited using a chemical vapor deposition (CVD) process. An aperture 416a, 416b is formed in each passivation layer 414a, 414b to expose at least a portion of each conductive bond pad 412a, 412b.

A copper pillar 420a, 420b is formed within each aperture 416a, 416b. Each copper pillar 420a, 420b is electrically and mechanically connected to the exposed portion of each conductive bond pad 412a, 412b. Each copper pillar 420a, 420b extends above a top surface of each passivation layer 414a, 414b. A nickel layer 424a, 424b is formed on each copper pillar 420a, 420b. Solder microbumps (not shown) composed of a lead-free solder including tin and silver (Sn—Ag) are formed on each nickel layer 424a, 424b respectively. Note that FIG. 4 depicts the solder microbumps after performance of a solder reflow process and as a result, the solder microbump of the first solder microbump assembly 410a and the second solder microbump assembly 410b are melted together and depicted as a unitary solder microbump structure 430.

The microbump construction illustrated in FIG. 4A is intended to be an example of a possible construction for the microbumps 114 illustrated in FIG. 1. It should be understood that the microbump construction illustrated in FIG. 4A may be varied in any number of ways, for example, by varying the construction of or removing one or more of the bond pads 412, passivation layers 414, apertures 416, pillars 420, nickel layers 424, and other elements, or by adding other elements.

Figure 4B:
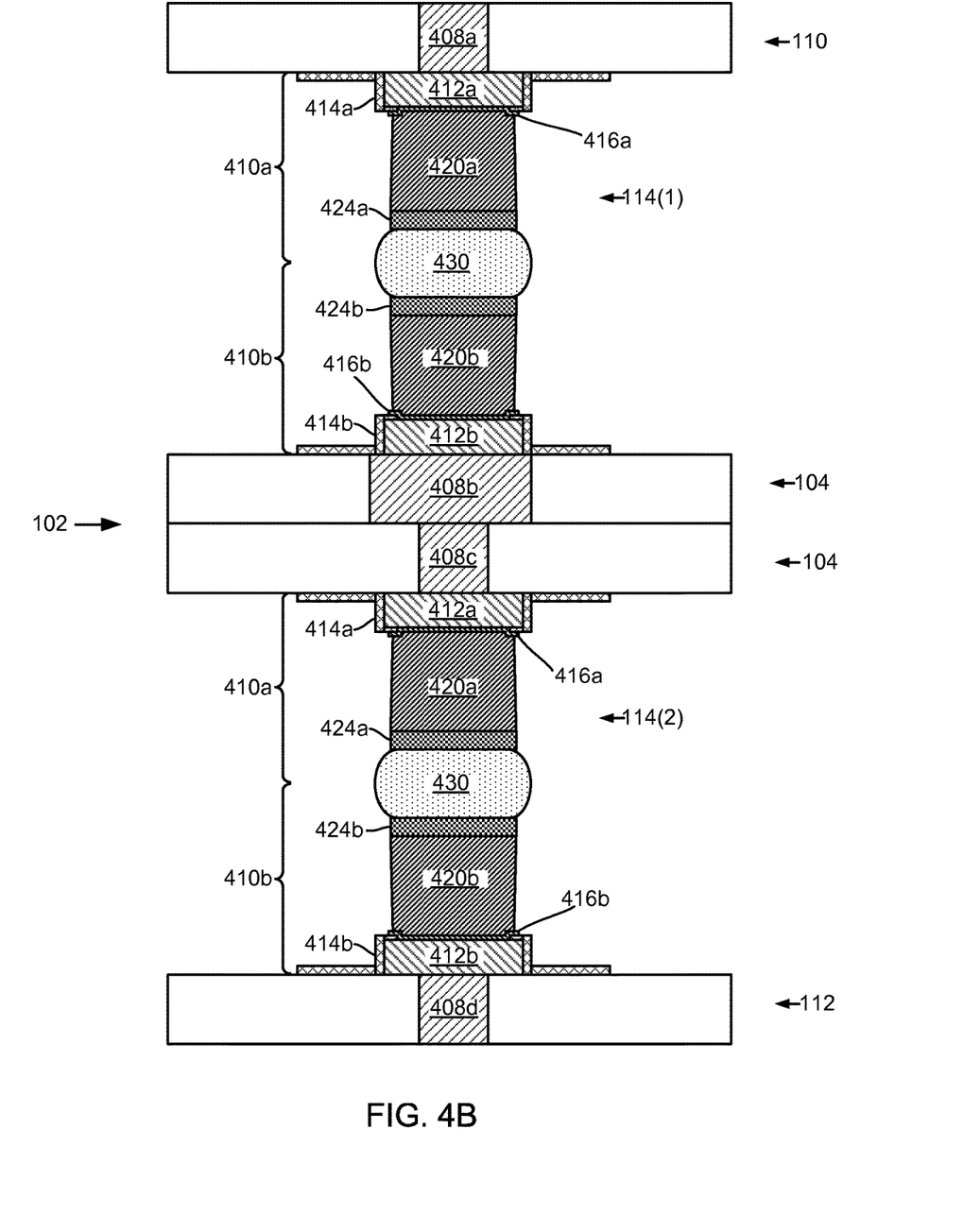
FIG. 4B is a detailed illustration of the interface between the first IC die, the silicon substrate-less interposer, and the second IC die of FIG. 1.

FIG. 4B is a detailed illustration of the interface between the first IC die, the silicon substrate-less interposer, and the second IC die of FIG. 1. FIG. 4B includes most of the same elements illustrated in FIG. 4A, but explicitly shows the connection between the microbumps 114 and the first IC die 110, the silicon substrate-less interposer 102, and the second IC die 112.

More specifically, a first microbump 114(1) is constructed substantially as illustrated with respect to FIG. 4A and electrically couples the first IC die 110 to a first layer 104 of the silicon substrate-less interposer 102. A second microbump 114(2) is also constructed substantially as illustrated with respect to FIG. 4A and electrically couples the silicon substrate-less interposer 102 to the second IC die 112.

The conductive elements 408(a), 408(b), 408(c), and 408(d) that are depicted may be conductive (e.g., metal) elements within the first IC die 110 and second IC die 112, and may be metal segments 106 within the metallization layers 104 of the silicon substrate-less interposer. The various metal segments 106 of the silicon substrate-less interposer 102 generally provide an electrical connection between elements of the first IC die 110 and the second IC die 112 so that the first IC die 110 may communicate with the second IC die 112 and so that both the first IC die 110 and the second IC die 112 may communicate with and receive power from external components, via C4 bumps 120. The communication and/or power transmission between the first IC die 110 and external elements may be direct (i.e., through metal segments 106 within the silicon substrate-less interposer 102) or through the second IC die 112. Similarly, the communication and/or power transmission between the second IC die 112 and external elements may be direct (i.e., through metal segments 106 within the silicon substrate-less interposer 102) or through the first IC die 110.

Figure 5A:
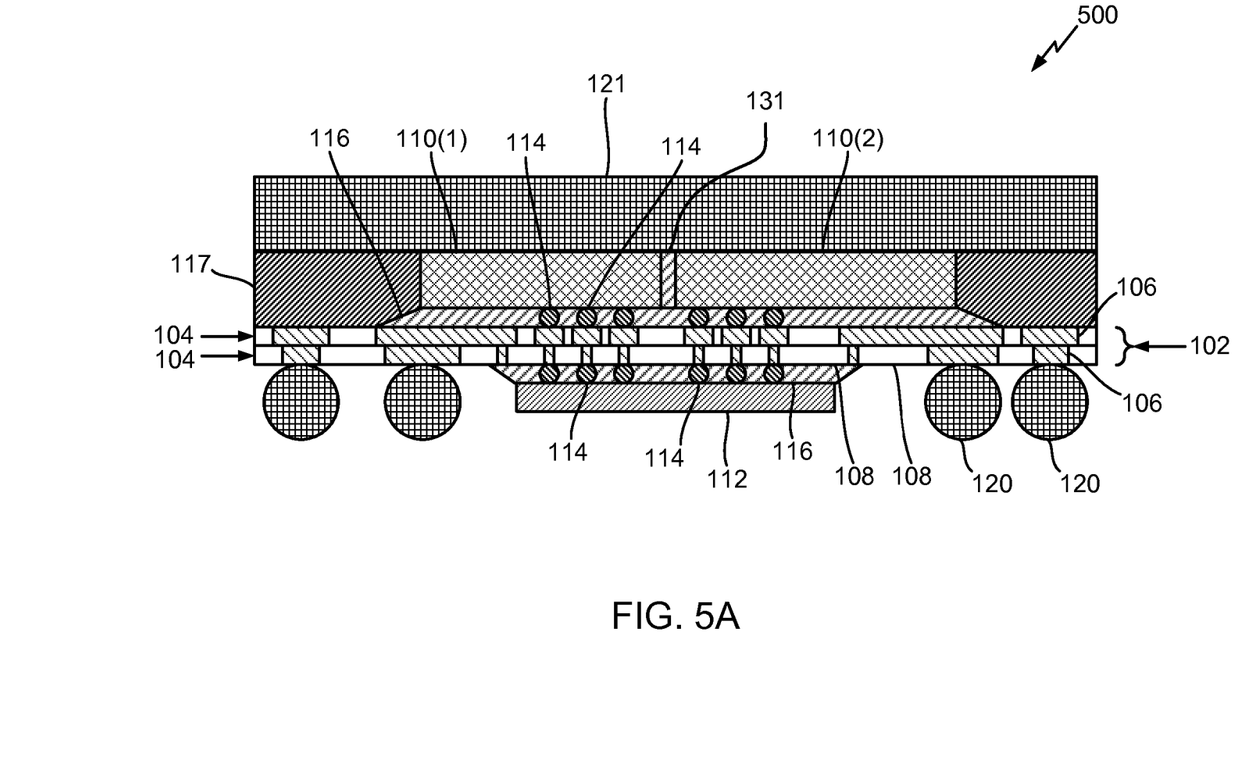
FIGS. 5A-5B illustrate configurations of a chip package include a silicon substrate-less interposer.
Figure 5B:
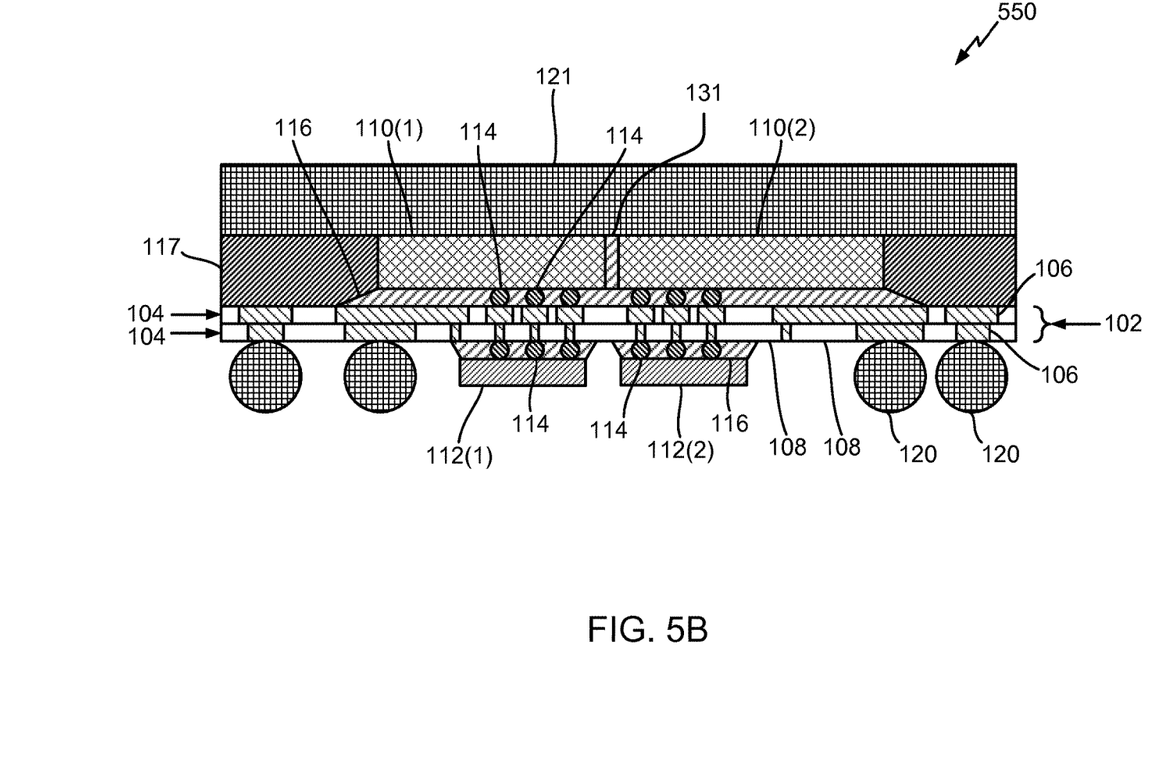

FIGS. 5A-5B illustrate alternative configurations of chip package 109, that include different numbers of IC dies. More specifically, FIG. 5A illustrates a first chip package 500 that includes two IC dies 110 on a first side of a silicon substrate-less interposer 102 and a single IC die 112 on the other side of the silicon substrate-less interposer 102. FIG. 5B illustrates a second chip package 550 that includes two IC dies 110 on a first side of a silicon substrate-less interposer 102 and two IC dies 112 on the other side of the silicon substrate-less interposer 102. An inter-die material 131 fills the space between the IC dies 110 and the IC dies 112. The inter-die material 131 may be the same material as mold encapsulation 117, underfill 116, or may be another supporting material. The parts of both the first chip package 500 and the second chip package 550 are constructed as described above with respect to FIGS. 1-4. Persons of skill in the art would understand that other alternative chip package configurations with other numbers of IC dies are possible.

As with the chip package 109 illustrated in FIG. 1, the various metal segments 106 of the silicon substrate-less interposer 102 generally provide an electrical connection between elements of the first IC dies 110 and the second IC dies 112 so that the first IC dies 110 may communicate with other first IC dies 110 or the second IC dies 112 and so that the first IC dies 110 and the second IC dies 112 may communicate with and receive power from external components, via C4 bumps 120. The communication and/or power transmission between a first IC die 110 and external elements may be direct (i.e., through metal segments 106 within the silicon substrate-less interposer 102) or through other first IC dies 110 or second IC dies 112. Similarly, the communication and/or power transmission between a second IC die 112 and external elements may be direct (i.e., through metal segments 106 within the silicon substrate-less interposer 102) or through first IC dies 110 or second IC dies 112.

Figure 6:
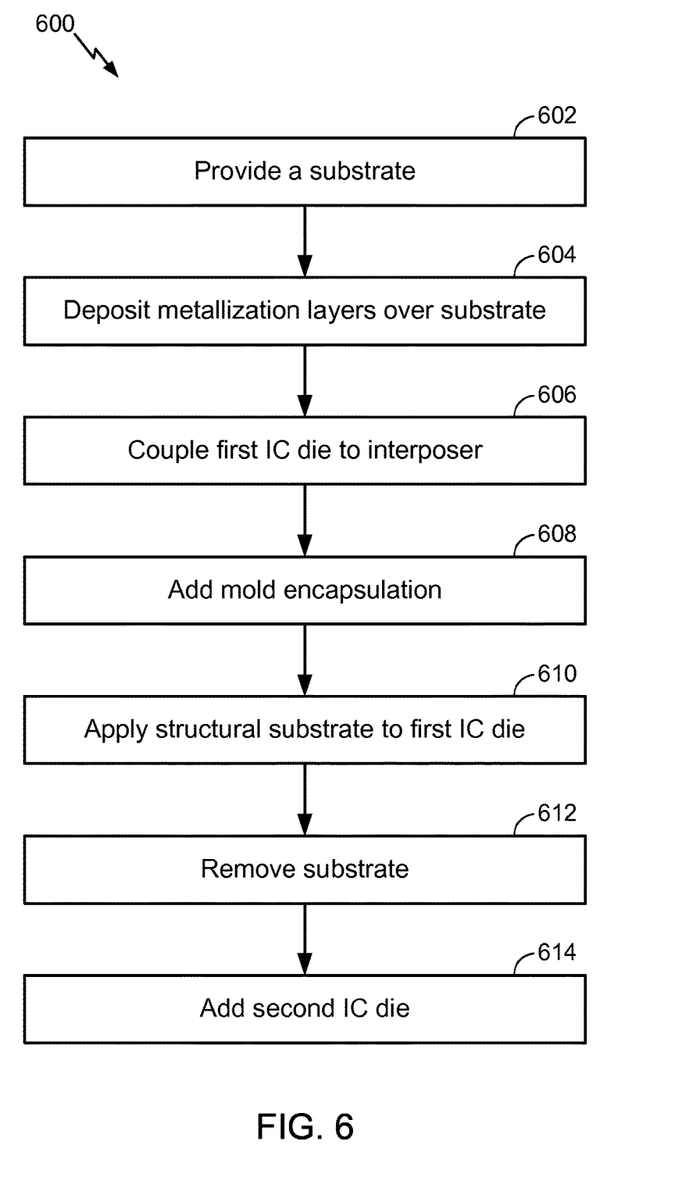
FIG. 6 is a flow diagram of method steps for fabricating the chip package of FIG. 1.

FIG. 6 is a flow diagram of method steps for fabricating the chip package 109 described above. Although the method steps are described in conjunction with FIGS. 1-5B, persons skilled in the art will understand that any system configured to perform the method steps, in any order, falls within the scope of this disclosure.

As shown, a method 600 begins at step 602, in which a substrate 202 is provided on which to form metallization layers 104. Optionally, the substrate 202 includes a passivation layer 302. At step 604, metallization layers 104 are deposited onto the substrate 202. When the substrate 202 includes a passivation layer 302, the metallization layers are deposited over the passivation layer 302 to form the interposer 102. At step 606, the first IC die 110 is added to the interposer 102, with microbumps 114 coupling metal segments 106 within the interposer 102 to the first IC die 110. The microbumps 114 may be formed via the techniques described above with respect to FIG. 4.

At step 608, a mold encapsulation 117 is added, surrounding the first IC die 110. At step 610, a structural substrate 121 is applied to the first IC die 110. At step 612, the substrate 202 is removed. At step 614, a second IC die 112 is coupled to the silicon substrate-less interposer 102 via microbumps 114, and C4 bumps 120 are added to the side of the interposer 102 to which the second IC die 112 is attached. When the substrate 202 includes the passivation layer 302, the passivation layer is first etched in the vicinity of metal segments to be electrically connected to the C4 bumps 120. Then, a second passivation layer 304 is deposited over the first passivation layer 302. Subsequently, an under bump metal layer 306 is deposited conformally over the second passivation layer 304 to provide a contact area for the C4 bumps 120. Finally, the C4 bumps 120 are formed over the under bump metal layer 306.

The chip package including a silicon substrate-less interposer allows for mounting an integrated circuit chip onto a board without the use of TSV's. Because TSV's increase design complexity, cost of manufacturing, and testing time, among other factors, providing an interposer without TSV's allows for reduced manufacturing difficulty and cost. Additionally, "hiding" the second IC die underneath the first IC die may provide security benefits in sensitive applications. More specifically, because the second IC die is physically blocked by the first IC die, eavesdropping and/or other security attacks against the second IC die may be less successful than if the second IC die were exposed.

While the foregoing is directed to certain examples, modifications may be devised without departing from the basic scope of this disclosure, and the scope thereof is determined by the claims that follow.

What is claimed is:

1. A stacked silicon interconnect product, comprising:
a substrate-less interposer consisting essentially of a plurality of metallization layers, wherein at least one metallization layer includes a plurality of metal segments separated by dielectric material, the dielectric material selected from silicon dioxide, SiN, and SiC;
a first die coupled to a first side of the substrate-less interposer via a first plurality of microbumps;
a second die coupled to a second side of the substrate-less interposer via a second plurality of microbumps, the second die communicatively coupled to the first die through a metallization layer of the plurality of metallization layers without routing through a through-substrate via (TSV); and
a plurality of controlled collapse chip connection (C4) bumps coupled to the second side of the substrate-less interposer.

2. The stacked silicon interconnect product of claim 1, wherein the substrate-less interposer further comprises:
a dielectric layer defining the second side of the substrate-less interposer, wherein the dielectric layer includes an opening exposing a metal segment included in the metallization layer.

3. The stacked silicon interconnect product of claim 2, wherein the substrate-less interposer further comprises:
a passivation layer formed on the dielectric layer and having an opening that corresponds spatially with the opening in the dielectric layer.

4. The stacked silicon interconnect product of claim 3, wherein the substrate-less interposer further comprises:
an under bump metal layer conformally formed in the opening of the dielectric layer, the under bump metal layer being in contact with the metallization layer.

5. The stacked silicon interconnect product of claim 1, wherein the plurality of C4 bumps are located laterally outward from the second die on the second side of the substrate-less interposer.

6. The stacked silicon interconnect product of claim 1, further comprising:
a first layer of underfill disposed between the first die and the first side of the substrate-less interposer.

7. The stacked silicon interconnect product of claim 6, further comprising:
a second layer of underfill disposed between the second die and the second side of the substrate-less interposer.

8. The stacked silicon interconnect product of claim 1, further comprising:
a third die coupled to the first side of the substrate-less interposer via a third plurality of microbumps communicatively coupled to the first metallization layers.

9. The stacked silicon interconnect product of claim 8, further comprising:
a fourth die coupled to the second side of the substrate-less interposer via a fourth plurality of microbumps communicatively coupled to the second metallization layer.

10. The stacked silicon interconnect product of claim 1, wherein:
the second side of the substrate-less interposer faces in an opposite direction to the first side of the substrate-less interposer.

* * * * *